United States Patent [19]

Miyamoto

[11] Patent Number: 4,616,342

[45] Date of Patent: Oct. 7, 1986

[54] SEMICONDUCTOR MEMORY DEVICE

[75] Inventor: Junichi Miyamoto, Yokohama, Japan

[73] Assignee: Tokyo Shibaura Denki Kabushiki Kaisha, Japan

[21] Appl. No.: 502,264

[22] Filed: Jun. 8, 1983

[30] Foreign Application Priority Data

Oct. 8, 1982 [JP] Japan .................. 57-177098

[51] Int. Cl.$^4$ .............................................. G11C 7/00
[52] U.S. Cl. .................... 365/190; 365/205; 365/230; 365/227
[58] Field of Search ............ 365/190, 227, 230, 203, 365/194, 205, 207, 208, 177; 307/530

[56] References Cited

U.S. PATENT DOCUMENTS

| | | | |
|---|---|---|---|
| 3,740,730 | 6/1973 | Ho et al. | 365/230 |
| 3,942,162 | 3/1976 | Buchanan | 365/203 |
| 3,983,412 | 9/1976 | Roberts et al. | 365/207 |
| 4,272,832 | 6/1981 | Ito | 365/189 |
| 4,335,449 | 6/1982 | Nokubo | 365/177 |
| 4,338,679 | 7/1982 | O'Toole | 365/203 |
| 4,355,377 | 10/1982 | Sud et al. | 365/203 |
| 4,367,538 | 1/1983 | Shimada | 365/230 |
| 4,417,328 | 11/1983 | Ochii | 365/203 |

OTHER PUBLICATIONS

Miyamoto et al, "A 1.0 μm N-Well CMOS/Bipolar Technology for VLSI Circuits", IEEE Electron Devices Meeting, Dec. 5-7, 1983, pp. 63-66.
Konishi, et al., "A 64Kb CMOS RAM," ISSCC Digest of Technical Paper, pp. 258-259, Feb. 12, 1982.
Ochii, et al., "A 15nW Standby Power 64Kb CMOS RAM," ISSCC Digest of Technical Paper, pp. 260-261 and 334, Feb. 12, 1982.

Primary Examiner—Terrell W. Fears
Assistant Examiner—Glenn A. Gossage
Attorney, Agent, or Firm—Finnegan, Henderson, Farabow, Garrett & Dunner

[57] ABSTRACT

A semiconductor memory device comprises word lines connected to a row of memory cells, pairs of bit lines each connected to a different column of memory cells, word line drive means for driving the word line, and data sensing means. The word line drive means drives a selected word line only during a predetermined time duration which is shorter than the time duration of a word selection signal. The data sensing means includes a differential amplifier including a pair of bipolar transistors connected at their base electrodes to a pair of bit lines. Within the predetermined shorter time period, the differential amplifier senses the data stored in a selected memory cell and that sensed data is latched by a latching circuit.

8 Claims, 14 Drawing Figures

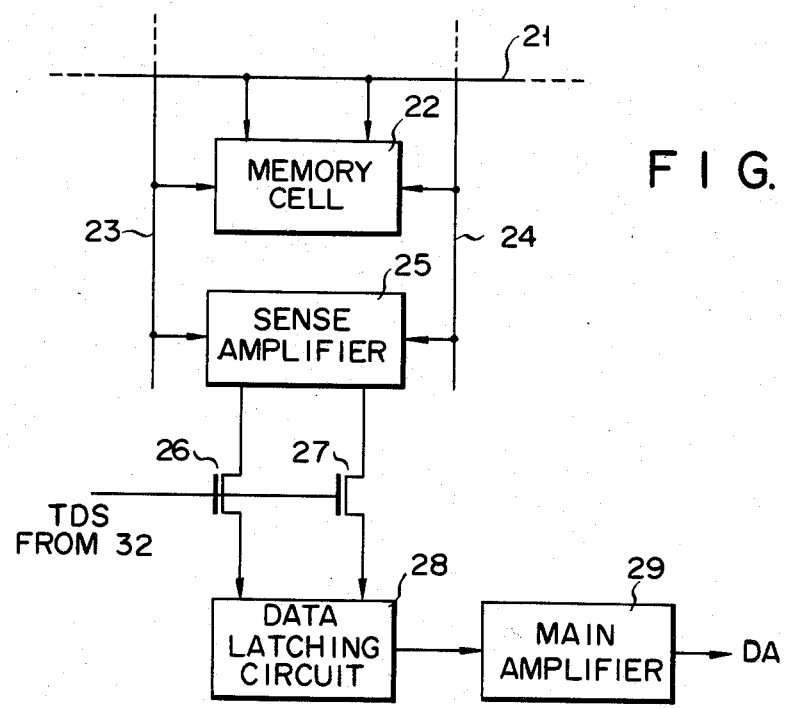
FIG. 3
FIG. 7A
ROW ADDRESS SIGNALS ADR
FIG. 7B
POTENTIAL DIFFERENCE BETWEEN TWO BIT LINES (FIG. 1)
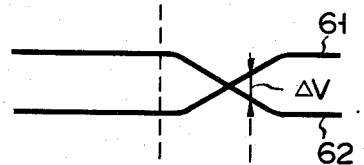
FIG. 7C
POTENTIAL DIFFERENCE BETWEEN TWO BIT LINES (FIG. 4)
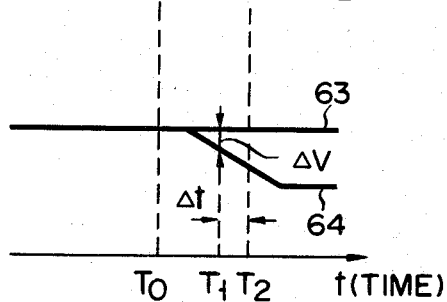

FIG. 5
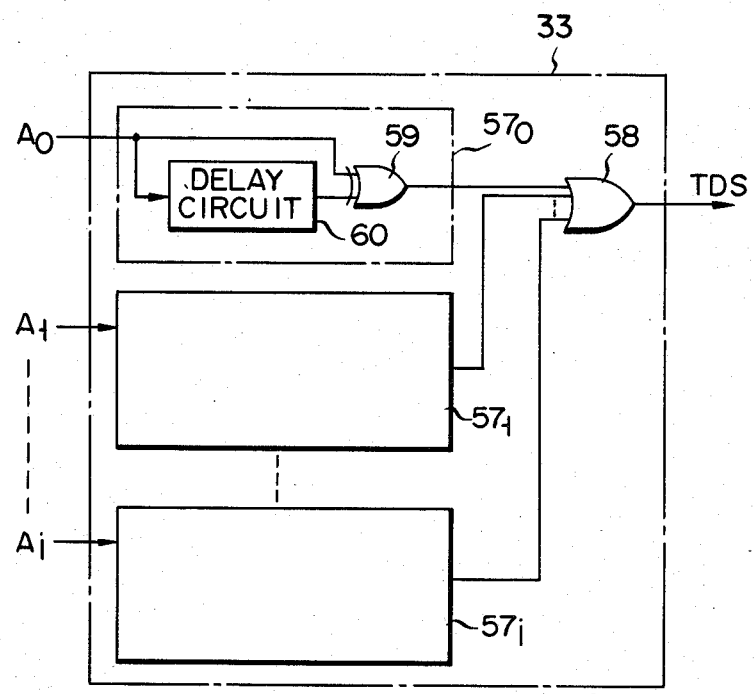
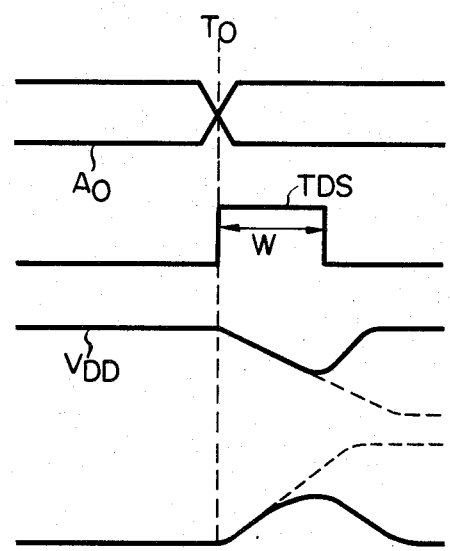
FIG. 6A  ROW ADDRESS SIGNALS ADR
FIG. 6B  OUTPUT OF TRANSIENT DETECTOR 33
FIG. 6C  BIT LINE POTENTIAL
FIG. 6D  CURRENT CONSUMPTION

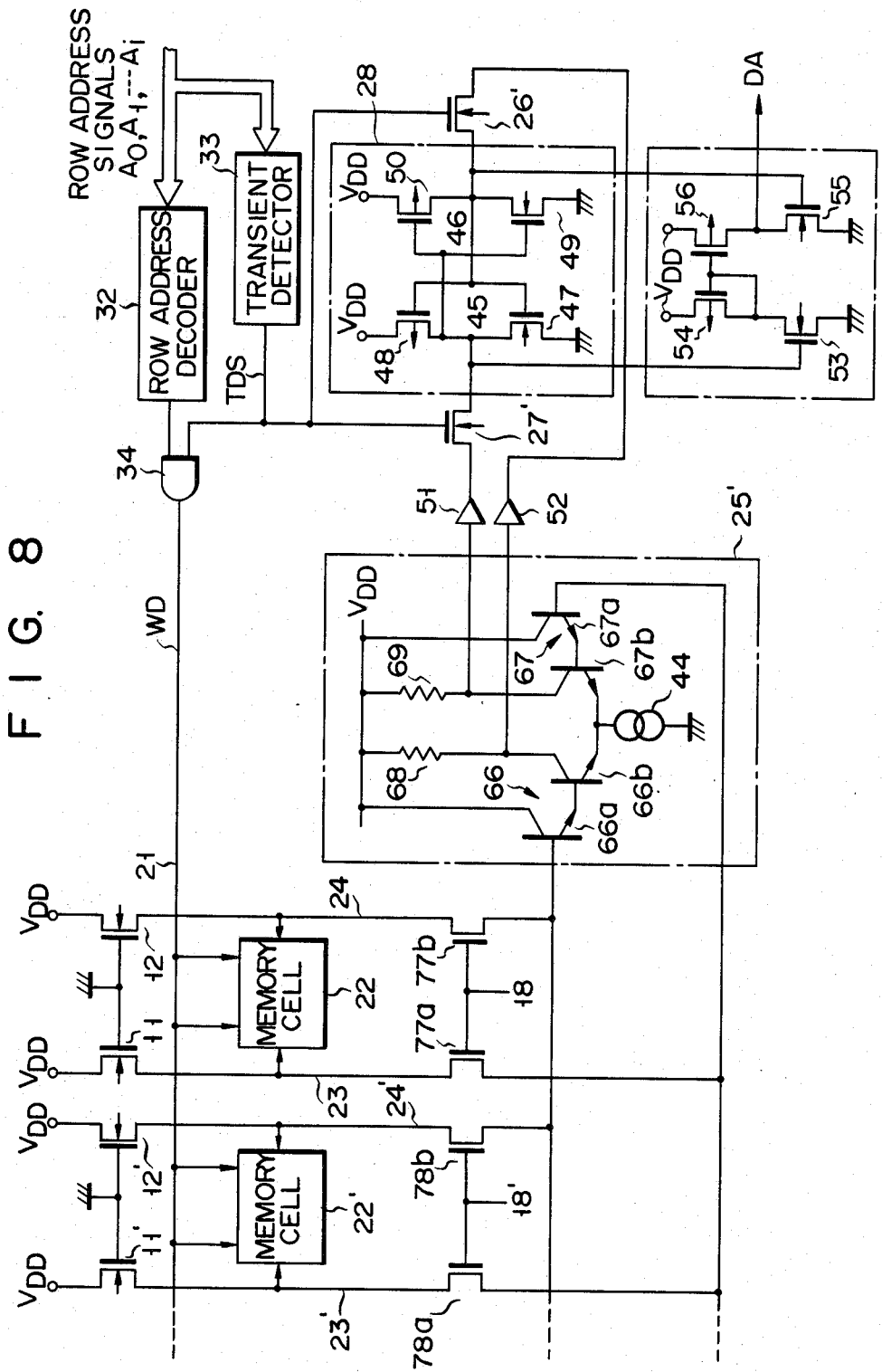

SEMICONDUCTOR MEMORY DEVICE

BACKGROUND OF THE INVENTION

The present invention relates to a semiconductor memory device including a plurality of memory cells each of which is formed of MOS (metal oxide semiconductor) transistors, and more particularly to a semiconductor memory device with an improved means for reading data from the memory cells.

An arrangement of a memory cell for constituting a prior art memory device is illustrated in FIG. 1 with its peripheral circuit. Although only a single memory cell is illustrated in the figure, a number of memory cells are actually arranged in a matrix fashion to form a memory device. As shown in FIG. 1, the memory cell 1 includes a first series circuit of a load resistor 2 and an MOS transistor 4, a second series circuit of a load resistor 3 and an MOS transistor 5, each of which being connected between a first power source $V_{DD}$ and a second power source $V_{SS}$ (earth potential); an MOS transistor 6 serving as a first transfer gate which is connected between a bit line 9 and a connection point of the load resistor 2 to the MOS transistor 4; and an MOS transistor 7 serving as a second transfer gate which is connected between a bit line 10 and a connection point of the load resistor 3 to the MOS transistor 5.

A word line 8 is connected to the gate electrodes of the MOS transistors 6 and 7. Precharge MOS transistors 11 and 12 are connected between the first power source $V_{DD}$ and the bit line 9 and between the first power source $V_{DD}$ and the bit line 10, respectively. The gate electrodes of these MOS transistors 11, 12 are kept at the potential of the second power source $V_{SS}$. Connected between the bit lines 9 and 10 is a sense amplifier 13 for sensing the data stored in the memory cell 1 in the form of a potential difference between the bit lines 9 and 10. The output signal from the sense amplifier 13 is applied to a main amplifier 16 through MOS transistors 14 and 15 serving as transfer gates. The main amplifier 16 serves to produce the data DA. Reference numeral 18 designates a column selection signal. Reference numerals 19 and 20 designate stray capacitances of the bit lines 9 and 10, respectively. The gate electrode of the MOS transistor 5 is connected to a connection point between the resistor 2 and the MOS transistor 4. The gate electrode of the MOS transistor 4 is connected to a connection point between the resistor 3 and MOS transistor 5.

In FIG. 1, when the word line 8 is selectively driven, the MOS transistors 6 and 7 are conductive. A pair of the bit lines 9 and 10 have been charged up to the potential of the first power source $V_{DD}$, by way of the precharge transistors 11 and 12. Therefore, when the word line 8 is driven, if the MOS transistor 4 is in an ON state and the MOS transistor 5 is in an OFF state, a current (DC) flows through a route (or current path) including the first power source $V_{DD}$, the bit line 9, the MOS transistor 6, the MOS transistor 4, and the second power source $V_{SS}$ (generally kept at an earth potential). As a result of the current flow, a potential difference appears between the bit lines 9 and 10. The potential difference is sensed by the sense amplifier 13. The sensed signal is applied to the main amplifier 16 through the transistors 14 and 15 which are ON-OFF controlled by the column selection signal 18. The data DA (corresponding to the ON state of the MOS transistor 4) stored in the memory cell is produced from the amplifier 16.

When a memory device of N bits is constituted by arranging memory cells shown in FIG. 1 in a matrix fashion, $\sqrt{N}$ memory cells are connected to the word line 8. Accordingly, when the data is read out from the memory cell 1 shown in FIG. 1 by selectively driving the word line 8, the DC current also flows through all the non-selected memory cells connected to the word line and belonging to non-selected columns. This DC current flows through the above current path during the time period in which the row selection signal applied to the word line 8 is kept at a second level (high level). This time period is called a one-cycle period of an address signal. The row selection signal is changed to the second level for turning the transistors 6, 7 ON from a first level for turning the transistors 6, 7 OFF. The relationship between the one-cycle time period of the address signal ADR and the current I flowing through the current path is illustrated in FIGS. 2A and 2B. As seen from the figures, the current I slightly increases at time points $T_0$ and $T_0'$ where the address signal ADR changes in level and is kept constant over the one-cycle time period. As seen from FIGS. 2A and 2B, in the prior memory device shown in FIG. 1, the current consumption in the memory device is extremely large because of the presence of the DC current flowing through the memory cell when the data is read out.

Making the conductance of the MOS transistors 11 and 12 small is one of the methods of reducing the current I. If this method is employed, the potential on the bit lines 9 and 10 is reduced to close to the earth potential. When the level drops to such a potential, two word lines are influenced by the capacitances 19 and 20 when the address signal ADR changes its level, and are high at the level changing time point $T_0$. A so called multi-access state occurs at this time point. In this multi-access state, the data in the memory cell is liable to be destroyed. Further, when the conductances of the MOS transistors 11 and 12 are decreased, the charge time for the bit lines 9 and 10 is increased and the data read speed is damaged.

SUMMARY OF THE INVENTION

An object of the invention is to provide a semiconductor memory device in which data read out speed is increased, the occurrence of a multi-access state is prevented, and current consumption is decreased.

The semiconductor memory device according to this invention comprises: memory cells arrayed in a matrix fashion; work lines each of which is connected to a corresponding group of the memory cells arrayed in a row direction; pairs of bit lines each pair of which is connected to a corresponding group of the memory cells arrays in a columnar direction; a row address decoder for decoding row address signals to produce a word line selection signal for driving a word line to be selected; word line drive means for driving the word line to be selected only during a predetermined time period shorter than a time duration of a second level of the word line selection signal when the same signal changes from a first level to the second level, the word line being driven by the second level signal; data sensing means for sensing within the predetermined time period the data stored in a memory cell selected according to a level of the output signal from the word line drive means through a pair of bit lines connected to the selected memory cell; data latching means for latching within the predetermined time period the data sensed by the data sensing means; and data output means for providing the data latched in the data latching means.

BRIEF DESCRIPTION OF THE DRAWINGS

FIG. 3 shows a block diagram of an embodiment of a semiconductor memory device according to the present invention;

FIG. 5 shows a detailed diagram of the transient detector shown in FIG. 4;

FIGS. 6A to 6D, and 7A to 7C show waveforms useful in explaining the operation of the transient detector of FIG. 4; and FIG. 8 shows a block diagram of another embodiment of a semiconductor memory device according to the present invention.

DETAILED DESCRIPTION OF THE PREFERRED EMBODIMENTS

Figure 1:
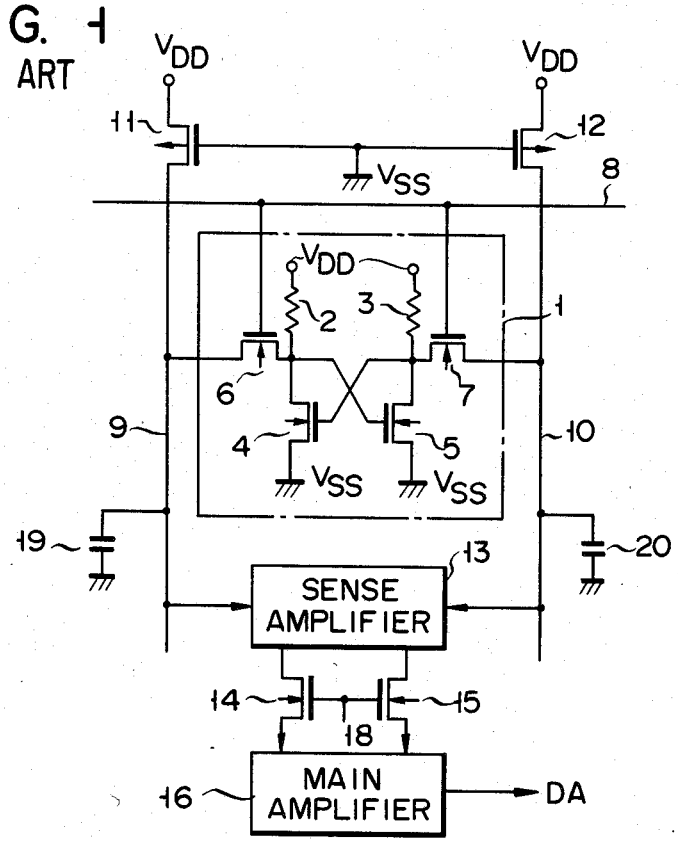
FIG. 1 shows a circuit diagram of a part of a prior art semiconductor memory device.
Figure 2A:
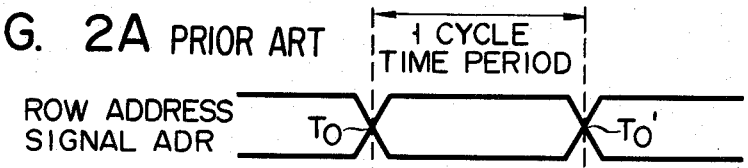
FIGS. 2A, 2B show waveforms useful in explaining the operation of the semiconductor memory device of FIG. 1.
Figure 2B:

In FIG. 3, when a word line 21 is driven by a word line selection signal, the data bit stored in a memory cell 22 is read out in the form of a potential difference between the bit lines 23 and 24. More specifically, a sense amplifier 25 senses a potential difference between the bit lines 23 and 24, that is, the data stored in the selected memory cell 22. The sensed data is supplied to a data latching circuit 28 through MOS transistors 26 and 27 operating as transfer gates. The word line 21 is driven only during a predetermined time period shorter than a time period during which the row address decoder (not shown) produces a word line selection signal for selecting the word line 21. The MOS transistors 26 and 27 are turned on only during the predetermined time period during which the word line 21 is driven by a signal WD (described later) which is applied to the gate electrodes. The main amplifier 29 reads out the latched data from the data latching circuit 28 and produces the data DA read out from the memory cell 22.

Only the features of the memory device under discussion different from the memory device shown in FIG. 1 will be described in detail. The word line 8 shown in FIG. 1 is driven during the time period that the row selection signal from the row address decoder is kept at high level. Therefore, the DC current flows through the current path into all the memory cells connected to the word line 8, and much current is consumed in this prior memory device. In the memory device shown in FIG. 3 or FIG. 4, the word line 21 is driven only during a predetermined time period shorter than the time period when the row selection signal from the row address decoder is kept at high level. The memory device in FIG. 3 is the same as the prior art memory device shown in FIG. 1 in that the DC current flows through all the memory cells connected to the word line 21. Note, however, that the time period during which the DC current flows into the memory cell 22 in the present embodiment is restricted to an extremely short time period till the data stored in the memory cell is read out and latched in the latching circuit 28. For this reason, the current consumption in the present memory device is remarkably reduced compared with the prior art memory device.

Figure 4:
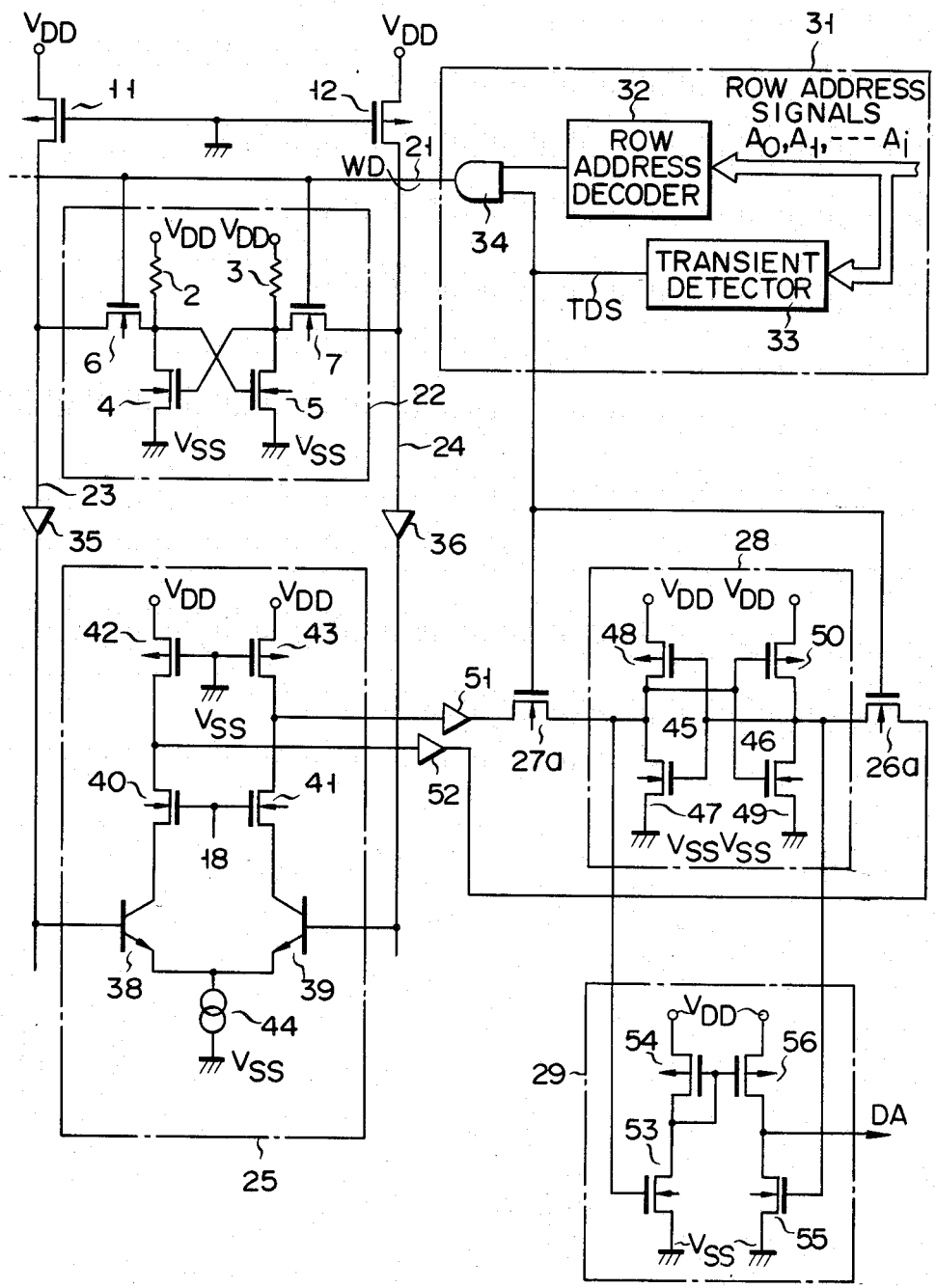
FIG. 4 shows a detailed arrangement of the embodiment of FIG. 3.

A circuit diagram corresponding to FIG. 3 is illustrated in FIG. 4. In the figure, an internal configuration of the memory cell 22 connected to the word line 21 and the bit lines 22 and 24 are exactly the same as that of the memory cell 1 shown in FIG. 1. In FIG. 4, like reference symbols are used for designating like or equivalent portions in FIG. 1. The drive circuit 31 for driving the word line 21 comprises a row address decoder 32 which produces a row selection signal for selecting the word line 21 when levels of the row address signals $A_0, A_2, \ldots, A_i$ are properly combined; a known transient detector 33 which receives the row address signals and detects a time point when one of the address signals changes its level to a level for selecting the word line 21 and produces a pulse signal TDS with a given pulse width at this time point; and an AND circuit 34 which receives the output signal from the row address decoder 32 and the output pulse signal TDS from the transient detector 33 and produces a drive signal WD for driving the word line 21. The output signal TDS from the transient detector 33 is further supplied to the gate electrodes of the MOS transistors 26a and 27a corresponding to the MOS transistors 26 and 27 shown in FIG. 3.

The bit line 23 is connected at one end to the first power source $V_{DD}$ through the precharge MOS transistor 11, and the other end thereof is extended through a level shift circuit 35. The bit line 24 is connected at one end to the first power source $V_{DD}$ via the precharge MOS transistor 12, and the other end thereof is extended through a level shift circuit 36.

The sense amplifier 25 is a differential amplifier composed of a series circuit including an npn driving transistor 38, an n-channel MOS transistor 40 for column selection, and a p-channel load MOS transistor 42 of which the source-drain path is connected at one end to the first power source $V_{DD}$, and another series circuit including an npn driving MOS transistor 39, an n-channel MOS transistor 41 for column selection, and an n-channel load MOS transistor 43 of which the source-drain path is connected at one end to the first power source $V_{DD}$. The emitters of the transistors 38 and 39 are connected to the second power source $V_{SS}$ through a constant current source 44. The gate electrodes of the MOS transistors 42 and 43 are connected to the second power source $V_{SS}$. The gate electrodes of the MOS transistors 38 and 39 are connected to the bit lines 23 and 24, respectively. A column selection signal 18 is supplied to the gate electrodes of the MOS transistors 40 and 41. During the predetermined time period that the word line 21 is driven by the word line drive signal WD, a potential difference between the bit lines 23 and 24 is amplified and the data of the memory cell 22 is sensed.

The data latching circuit 28 is composed of a flip-flop including first and second CMOS inverters 45 and 46. The first inverter 45 includes an n-channel MOS transistor 47 and p-channel MOS transistor 48, which are connected in series between the power sources $V_{SS}$ and $V_{DD}$. The second inverter 46 contains an n-channel MOS transistor 49 and a p-channel MOS transistor 50, which are connected between the power sources $V_{SS}$ and $V_{DD}$. A connection point between the source-drain paths of the transistors 47 and 48 is connected to the gate electrodes of the MOS transistors 49 and 50. A connection point between the source-drain paths of the MOS transistors 49 and 50 is connected to the gate electrodes of the MOS transistors 47 and 48. One of the output terminals of the sense amplifier 25, as a connection point between the source-drain paths of the MOS transistors 41 and 43, is connected to a connection point between the source-drain paths of the MOS transistors 47 and 48, through a level shift circuit 51 and the MOS transistor 27a. The other output terminal of the sense amplifier, as a connection point between the source-drain paths of the MOS transistors 40 and 42 is connected to a connection point between the source-drain paths of the MOS transistors 49 and 50 through a level shift circuit 52 and the MOS transistor 26a. The MOS transistors 26a and 27a are turned on only during the time period that these transistors are applied with the output pulse TDS from the transient detector 33; that is, a time period that the word line 21 is driven by the drive signal WD. Then, the latching circuit latches the data sensed by the sense amplifier 25.

The main amplifier 29 is composed of a series circuit containing an n-channel driving MOS transistor 53 and a p-channel load MOS transistor 54, and another series circuit containing an n-channel driving MOS transistor 55 and a p-channel load MOS transistor 56. The MOS transistors 54 and 56 are commonly connected at the gate electrodes and the gate electrodes are connected to a connection point of the source-drain paths of the MOS transistors 53 and 54. With this connection, these transistors form a so called current mirror circuit. The gate electrode of the MOS transistor 53 is connected to a connection point between the source-drain paths of the MOS transistors 47 and 48. A gate electrode of the MOS transistor 55 is connected to a connection point of the source-drain paths of the MOS transistors 49 and 50. When data is latched in the data latching circuit 28, the main amplifier 29 reads out the data and produces the data at a connection point between the source-drain paths of the MOS transistors 55 and 56.

An example of a practical arrangement of transient detector 33 used in the circuit arrangement shown in FIG. 4 is illustrated in FIG. 5. Address signals $A_0$, $A_1$, ..., $A_i$ shown in FIG. 4 are applied through differential circuits $57_0$, $57_1$, ..., $57_i$ to an OR circuit 58. The OR circuit 58 produces the pulse signal TDS. Since the differential circuits $57_0$ to $57_i$ have the same construction, the construction of only the differential circuit $57_0$ is typically illustrated. As shown, the address signal $A_0$ is applied to one of the input terminals of an exclusive OR circuit 59 and through a delay circuit 60 to the other input terminal of the same. It is assumed that when the address signal ADR changes its logic level from low to high, the address decoder 32 generates a selection signal for the word line 21, as shown in FIG. 6A. At $T_0$ of the level-change time point of the address signal, the exclusive OR circuit 58 or the transient detector 33 produces a pulse signal TDS with a pulse width W, as shown in FIG. 6B. This pulse signal TDS drives the word line 21 for the time duration equal to the pulse width W. Therefore, the word line 21 is driven for a period shorter than the one-cycle period of the address signal ADR or the address signal $A_0$, for example, and is kept at high level. The pulse width W may be controlled by changing a delay time of the delay circuit 60.

As described above, when the word line 21 is driven for a period corresponding to the pulse width W by the drive signal WD, the DC current flows through the MOS transistor 11, the bit line 23, and the MOS transistors 6 and 4 if the memory cell 22 has a memory state that the MOS transistor 4 is in an ON state. Therefore, a potential difference appears between the bit lines 23 and 24. The potential difference is sensed by the sense amplifier 25, as described above. When MOS transistors are used for the driving transistors of the sense amplifier 25 as in the prior art, if the first power source $V_{DD}$ is set at 5 V, at least a potential difference of 2.5 V between the bit lines is required for the sense amplifier to sense the potential difference. As shown in FIG. 4, however, if the bipolar transistors 38 and 39 are used as driving transistors, the sense amplifier 25 can sense the 0.5 V of the potential difference. The detected data is latched in the data latching circuit 28 within the time period that the word line 21 is being driven by the drive signal WD, as has already been stated.

A changing state of the potential on a bit line and the current consumption in a memory cell will be described referring to FIGS. 6A to 6D. The waveforms of FIGS. 6A and 6B have already been described. FIG. 6C illustrates a changing state of the potential on a single bit line, for example, the bit line 23. When the address signal $A_0$ is low, the word line 21 is not driven and hence the bit line 23 is precharged, so that the bit line 23 is kept at the potential level of the first power source $V_{DD}$. When the address signal $A_0$ is changed in its logic level from low to high, the bit line 21 is driven during the time period of the pulse width W. Accordingly, the potential on the bit line 23 decreases until the trailing edge of the pulse TDS appears.

The MOS transistor 6 is turned off at the trailing edge of the pulse TDS, so that the potential on the bit line 23 rises again to reach the potential of the power source $V_{DD}$. Meanwhile, in the case of the FIG. 1 memory device, the drive time of the word line 8 is longer than W and hence the potential on the bit line 9 decreases as indicated by a dotted line in FIG. 6C and then is kept at a given potential. FIG. 6D illustrates a changing state in the current consumption based on the DC current flowing through a bit line 23. Before time $T_0$, the word line 21 is not driven, so that the current consumption is kept at a low level. During the time period from the leading to trailing edges of the pulse TDS, a DC current flows through the bit line 23, thus increasing the current consumption.

After the trailing edge of the pulse TDS, the current consumption gradually decreases to settle down at a fixed value. On the other hand, in the prior art memory device shown in FIG. 1, the current consumption continues its increase after the pulse TDS falls and is kept at a fixed value, as indicated by a dotted line in FIG. 6D.

If the precharge MOS transistors and the driving MOS transistors for the memory cell are equal to each other in size, the current consumption based on the DC current flowing through the bit line in the present embodiment of FIG. 4 is approximately 1/5 that of the FIG. 1 device. The embodiment of FIG. 4 employs the sense amplifier 25 using the bipolar transistors 38 and 39. For this reason, the embodiment in FIG. 4 may stop the drive of the word line 21 when the potential difference between the bit lines 23 and 24 is about 0.25 V. Therefore, the current consumption in a read mode in this memory device is 1/100 that of the FIG. 1 device.

The embodiment shown in FIG. 4 further provides the following useful effects. In FIG. 4, during the time period that the data is read out from the memory cell 22 by which the word line 21 is energized, the data is sensed by the sense amplifier 25 and latched by the data latching circuit 28. Therefore, the data can reliably be read out. As already described referring to FIG. 1, there is no need to decrease the conductance of the precharge MOS transistors to reduce the current consumption when the data is read out. Because of this feature, the potential on the bit lines does not fall to the earth potential. Therefore, the precharge time of the bit lines can be shortened, helping to speed up the data read operation. The reduction of the drive time of the word line 21 is sure to prevent the multi-access state from occurring in the memory device.

The reason why the data read speed is improved will be described in detail referring to FIGS. 7A to 7C. FIG. 7A illustrates a level-changing point $T_0$ of the address signal ADR. In FIGS. 7B and 7C, reference numerals 61 and 62 designate, respectively, the first and second bit lines of the prior art memory device having the indicated potential levels and reference numerals 63 and 64 the first and second bit lines of the present invention having also designate, respectively, the indicated potential levels. The first bit line 61 is gradually precharged to elevate the potential level after a given time from the point $T_0$, as indicated in FIG. 7B, and the second bit line 62 is similarly discharged to decrease the potential level, as indicated in FIG. 7B. The time taken for a potential difference between the bit lines 61 and 62 to be $\Delta V$ is $(T_2 - T_0)$ In FIG. 7C, if the potential on the bit line 63 starts to drop at a time point $T_0'$ (not shown) immediately before the time point $T_0$, this discharging operation is stopped for an extremely short period of time after the time point $T_0'$ and then the bit line 63 is precharged. Accordingly, at time $T_0$, the bit line 63 is completely precharged at a high potential. At time $T_0$, the bit line 64 starts to discharge and its potential gradually drops to a difference $\Delta V$ from the potential on the bit line 63. The time period providing the potential difference $\Delta V$ between the bit lines 63 and 64 is indicated by $(T_1 - T_0)$. If a sensor capable of sensing $\Delta V$ is used and the discharging rates of the bit lines 62 and 64 are equal to each other, the data sensing speed of the memory device of the present invention is $(T_1 - T_0)$, while that of the prior art memory device is $(T_2 - T_0)$. This indicates that data read out speed of the, memory device of the present invention can be increased by $\Delta t$.

In the FIG. 4 embodiment, a single sense amplifier 25 is connected to a pair of bit lines. This connection arrangement, however, is defective in that the entire area of the memory device is large. FIG. 8 illustrates another embodiment of a semiconductor memory device according to the present invention, which has successfully solved such a problem. In this embodiment, a single sense amplifier is used for a plurality of pairs of bit lines. In FIG. 8, a sense amplifier 25' includes Darlington input bipolar transistors 66 and 67. The sense amplifier 25' includes load resistors 68 and 69 connected to the power source $V_{DD}$ and a constant current source 44 connected as shown in the figure. The sense amplifier 25' has a high input impedance and a level shift function for the input signal thereto. The bit lines 23 and 24 connected to the memory cell 22 are connected to the base electrodes of bipolar transistors 66a and 67a through MOS transistors 77a and 77b, respectively. Bit lines 23' and 24' connected to a memory cell 22' are respectively connected to the transistors 66a and 67a through MOS transistors 78a and 78b. One output terminal between the transistor 67b and the resistor 69 is connected to one of the input terminals of the data latching circuit 28, through the level shift circuit 51 and the MOS transistor 27'. The other output terminal between the transistor 66b and the resistor 68 is connected through a level shift circuit 52 and a MOS transistor 26' to the other input terminal of the data latching circuit. The base electrodes of the transistors 77a, 77b and 78a 78b are controlled by column selection signals 18 and 18', respectively.

It should be understood that the present invention is not limited by the above-mentioned embodiments. For example, MOS transistors may be used for the input transistors of the sense amplifier. In this case, it is necessary to make the potential difference between the bit lines 23 and 24 large enough that the sense amplifier can reliably sense the potential difference. If the bipolar transistors are used for the input transistors of the sense amplifier, the drive time for the word line can further be reduced, making the present invention more effective. The level shift circuits 35, 36, 51 and 52 may be omitted if necessary.

What is claimed is:

1. A semiconductor memory device responsive to row address signals and a column selection signal comprising:

memory cells arrayed in a matrix of rows and columns of memory cells;

word lines, each of which is connected to different row of said memory cells;

pairs of bit lines, each pair of which is connected to a different column of said memory cells;

a row address decoder for decoding said row address signals to produce a word line selection signal lasting for a first predetermined duration;

word line drive means, coupled to said row address decoder and said word lines, for driving said selected word line at a first level only during a second predetermined time duration, said second predetermined time duration beig shorter than said first predetermined time duration, said word line drive means being activated when said word line selection signal changes from a second level to said first level;

data sensing means for sensing, within said second predetermined time period, data stored in a selected memory cell coupled to said selected word line, said data being sensed through one of said pairs of bit lines which is connected to said selected memory cell, and said data sensing means including a differential amplifier having a pair of transfer gates coupled to and controlled by said a column selection signal, and pair of bipolar transistors each having a base electrode connected to a different one of said one pair of bit lines and each having an emitter-collector path serially connected to a different one of said transfer gates;

data latching means coupled to said data sensing means for latching said data sensed by said data sensing means within said second predetermined time duration; and data output means coupled to said data latching means for outputting said data latched in said data latching means.

2. A semiconductor memory device according to claim 1 wherein said word line drive means includes a transient detector having means for receiving said row address signals and for detecting when one of said row address signals changes to said first level, means coupled to said receiving and detecting means, for producing a pulse with a given pulse width in response to said receiving and detecting means, and an AND circuit coupled to said word line selection signal from said row address decoder and said pulse from said transient detector to apply a drive signal to said selected word line only during said second predetermined time duration.

3. A semiconductor memory device according to claim 2 wherein the data latching means includes a pair of second transfer gates under the control of said pulse from said transient detector, each of said second transfer gates having a conduction path coupled in series with said data sensing means.

4. The semiconductor memory device of claim 1 wherein each of said cells comprises an MOS transistor;

wherein said semiconductor memory device further comprises a pair of first level shifters whose inputs are connected to a corresponding one of said pairs of bit lines; and a pair of second level shifters whose inputs are connected to an output of said data sensing means;

wherein said pair of bipolar transistors in said data sensing means are connected to outputs of said first level shifters; and wherein said data latching means comprises MOS transistors having inputs connected to outputs of said second level shifters.

5. A semiconductor memory device responsive to row address signals and a column selection signal comprising:

memory cells arrayed in a matrix of rows and columns of memory cells;

word lines, each of which is connected to a different row of said memory cells;

pairs of bit lines, each pair of which is connected to a different column of said memory cells;

a row address decoder for decoding said row address signals to produce a word line selection signal lasting for a first predetermined duration;

word line drive means, coupled to said row address decoder and said word lines, for driving said selected word line at a first level only during a second predetermined time duration, said second predetermined time duration being shorter than said first predetermined time duration, said word line drive means being activated when said word line selection signal changes from a second level to said first level;

data sensing means for sensing, within said second predetermined time duration, data stored in a selected memory cell coupled to said selected word line, said data being sensed through one of said pairs of bit lines which is connected to said selected memory cell, and said data sensing means including a Darlington-connected differential amplifier including a pair of bipolar transistors each having a base electrode connected to a different one of said pairs of bit lines, and transfer gates coupled to and controlled by said column selection signal;

data latching means coupled to said data sensing means for latching said data sensed by said data sensing means within said second predetermined time duration; and data output means coupled to said data latching means for outputting said data latched in said data latching means.

6. A semiconductor memory device according to claim 5 wherein said word line drive means includes a transient detector having means for receiving said row address signals and detecting when one of said row address signals changes to said first level, means coupled to said receiving and detecting means, for producing a pulse with a given pulse width in response to said receiving and detecting means, and an AND circuit which receives the word line selection signals and said pulse from said transient detector and forms a drive signal to be applied to said word line only during said second predetermined time duration.

7. A semiconductor memory device according to claim 6, wherein said data latching means includes a pair of second transfer gates under the control of said pulse from said transient detector, each of said second transfer gates having a conduction path coupled in series with said data sensing means.

8. A semiconductor memory device according to claim 5 further comprising:

a pair of level shifters having inputs connected to outputs of said data sensing means;

wherein each of said memory cells comprises an MOS transistor; and wherein said data output means comprises MOS transistors having inputs connected to outputs of said level shifters.

* * * * *